March 4, 1969 A. GODFREY 3,431,499

FREQUENCY DIVIDERS

Filed Aug. 25, 1965 Sheet 1 of 3

March 4, 1969 A. GODFREY 3,431,499

FREQUENCY DIVIDERS

Filed Aug. 25, 1965 Sheet 3 of 5

United States Patent Office 3,431,499

Patented Mar. 4, 1969

3,431,499
FREQUENCY DIVIDERS

Alan Godfrey, Hambledon, England, assignor to The Plessey Company Limited, Ilford, England, a British company Filed Aug. 25, 1965, Ser. No. 482,552
Claims priority, application Great Britain, Sept. 4, 1964, 36,439/64
U.S. Cl. 328—48 4 Claims
Int. Cl. H03k 21/32

ABSTRACT OF THE DISCLOSURE

A frequency divider for affording a continuously variable division ratio under the control of switching means, in which control means is provided for changing the division ratio of the frequency divider by a predetermined amount from that set into it without further adjustment of said switching means.

The invention relates to electrical devices and is especially applicable to electrical oscillation generators.

According to one aspect of the invention we provide a variable divider settable to any one of a number of values, and which may be incorporated in an electrical oscillation generator including a standard frequency source and a slave oscillator of frequency variable over a required range under control of a variable divider, the variable divider including at least two counters wherein said counters, with the exclusion of the most significant counter, includes control means effective for changing the division ratio of the variable divider by a predetermined amount from that set into the variable divider.

Each counter may comprise a plurality of bistable devices and gating means, and arranged to be operated according to either of two cycling modes which for convenience will hereinafter be called the "normal cycle" and the "reset cycle." The control means may be arranged so that when the apertaining counter reaches a predetermined state in its reset cycle, it may be further reset so that the division ratio of the variable divider is changed by a predetermined amount.

Figure 1:
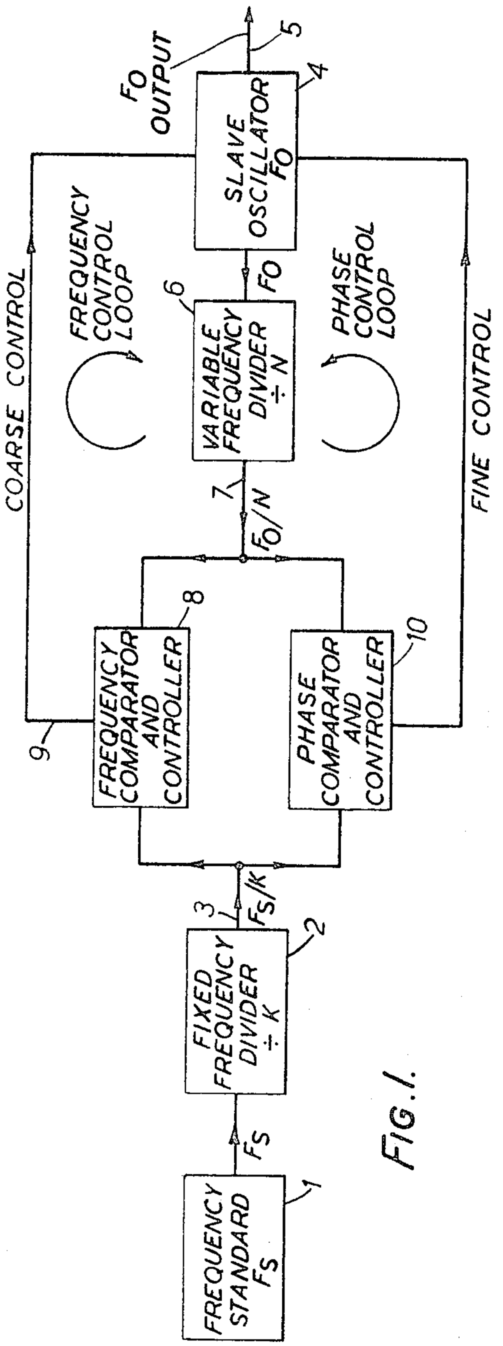
Figure 2:
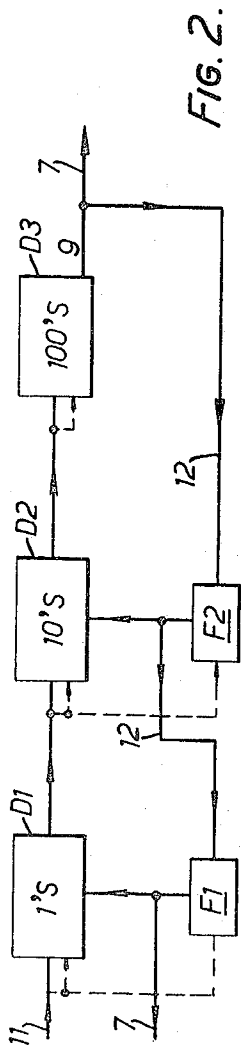
Figure 3A:
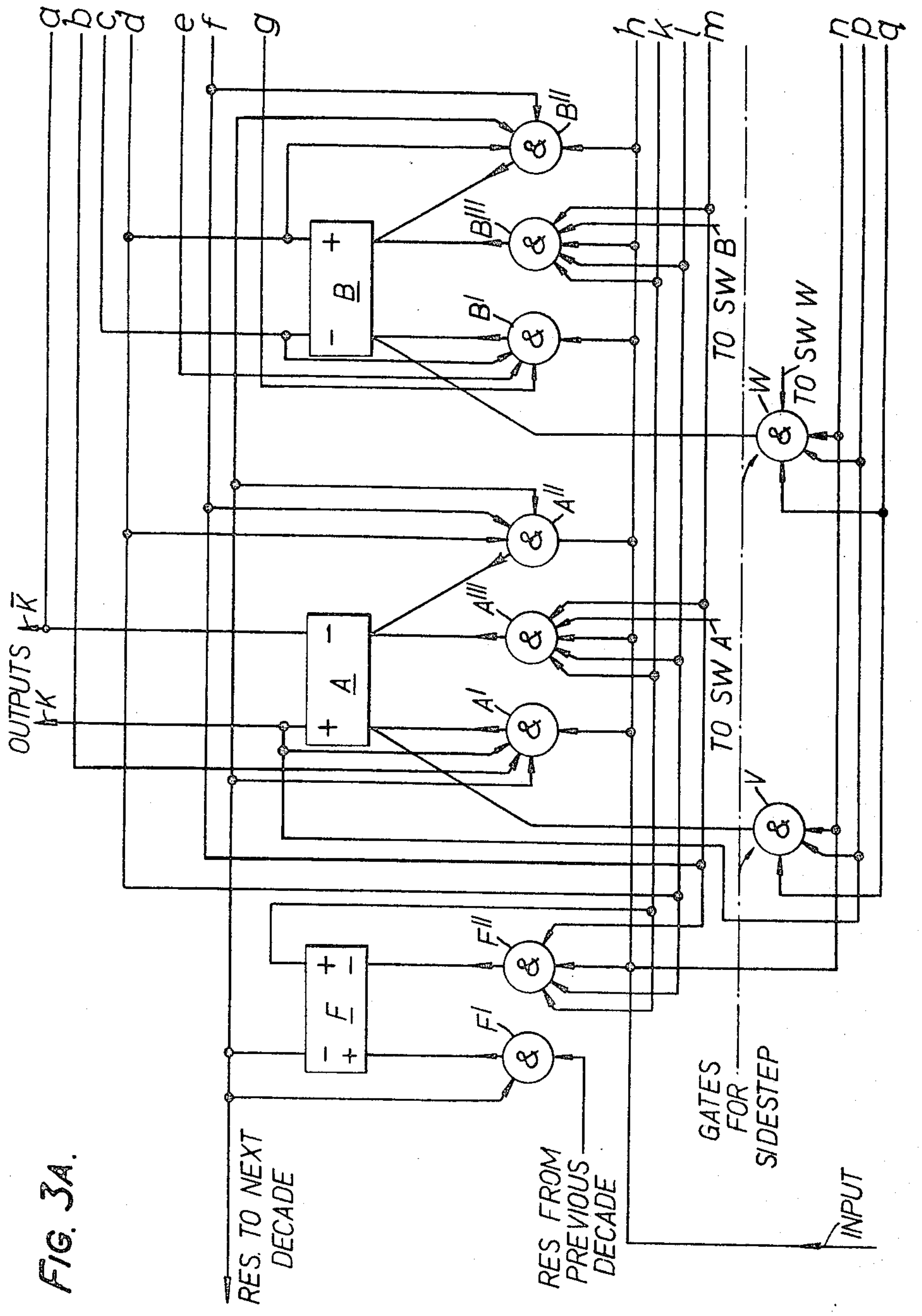
Figure 3B:
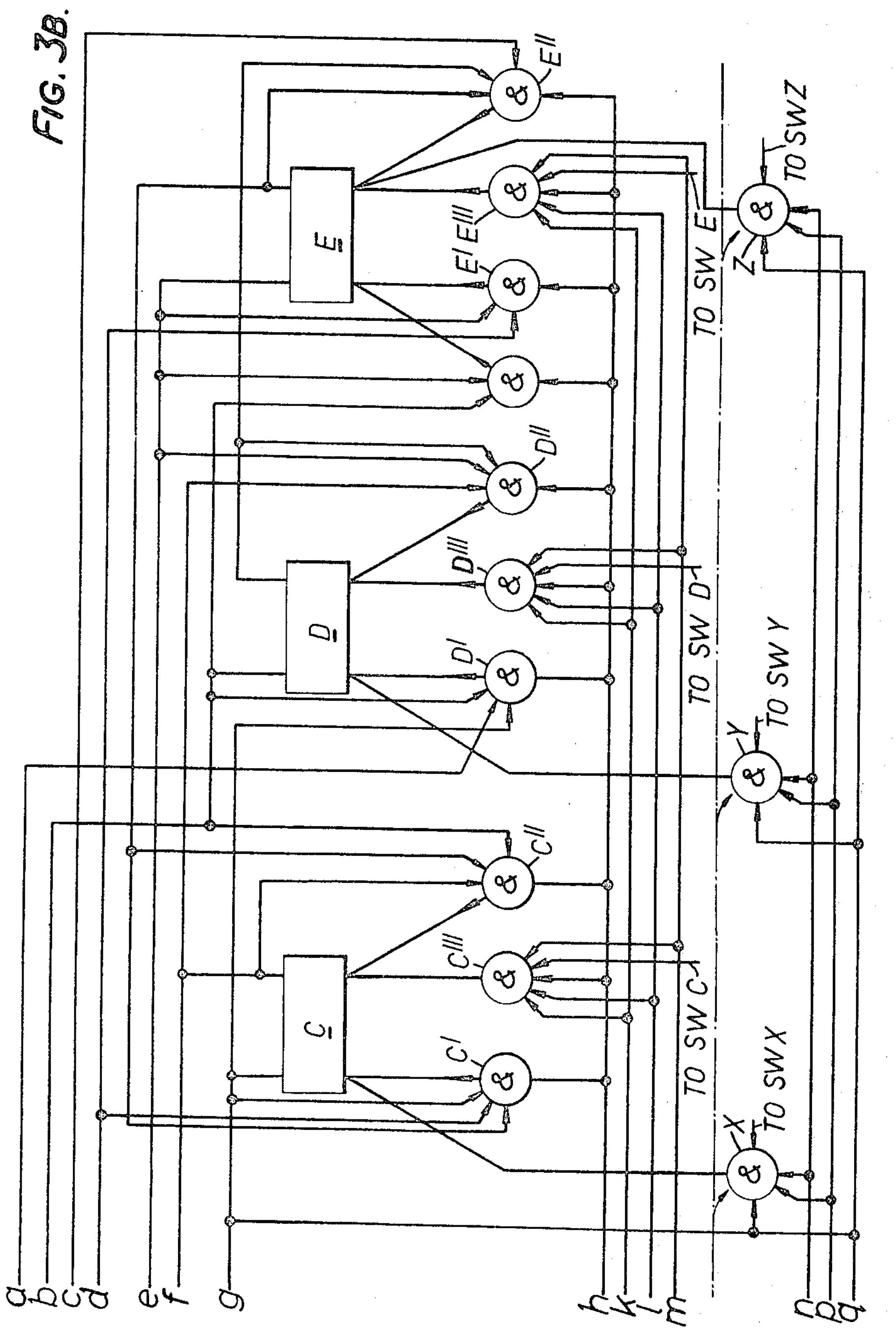

The foregoing and other features of the invention will be evident from the following description of a variable frequency oscillation generator embodying the invention in its preferred form. The description refers to the accompanying drawings, in which FIGURE 1 is a general block diagram of the apparatus;

FIGURE 2 is a block diagram of the variable frequency divider of FIGURE 1 in greater detail; and, FIGURES 3A and 3B together are a block diagram of one of the decade counter stages of FIGURE 2 in greater detail.

Circuit elements shown in block form in the drawings are all examples of devices in wide-spread current use, so that detailed description of their circuit arrangement is unnecessary.

The apparatus shown in the drawings forms an oscillation generator capable of covering a wide frequency range, in fixed frequency steps, with accuracy determined by a single frequency source, such as a crystal-controlled oscillator, that constitutes its internal standard of frequency. Any frequency within its range can be set up directly by means, for example, of a series of decade switches calibrated directly in frequency.

Referring now firstly to FIGURE 1, the oscillation generator comprises a crystal-controlled master oscillator 1 serving as a frequency standard and operating at a frequency F*s*, and a digital frequency divider 2 operating at a fixed division factor K to produce on its output line 3, a train of pulses at a repetition frequency $Fs/K$. The useful output of the generator is obtained from a slave oscillator 4 tunable over the required frequency range. In order to control the frequency of the slave oscillator 4 to a selected integer multiple of the base frequency $Fs/K$, the output of the slave oscillator 4, in addition to being supplied to an output line 5, is also supplied to a second frequency divider 6, which likewise operates on the digital principle, but the division factor N of which, in contrast to that of divider 2, is adjustable to any one of the digital numbers corresponding to the multiples of the base frequency at which slave oscillator 4 is required to be operable. Both dividers 2 and 6 are arranged to supply a pulse output, and both the output of fixed ratio divider 2, via its output line 3, and the output of variable-ratio frequency divider 6, via a line 7, are supplied as inputs to a frequency comparator and controller 8, which via control loop 9 varies the tuning of the slave oscillator 4 to increase or decrease the oscillation frequency when the number of pulses received from line 3 exceeds the number of pulses received from line 7 or vice versa. When the frequency of pulses produced by the slave oscillator 4 is close to the desired frequency, comparatively long periods will arise in which no excess pulse is received by either line 3 or line 7, and accordingly a phase-responsive control is arranged to be provided in these circumstances by means of a phase comparator 10 which produces an output proportional to the phase difference between pulses received respectively from lines 3 and 7, the phase-comparator output being utilized for a fine control of the slave-oscillator frequency firmly locking that frequency to the selected multiple of the base frequency produced from the frequency standard.

It is convenient in certain circumstances to offset the division ratio of the frequency divider over the whole frequency range, e.g. if the oscillation generator is the local oscillator of a receiver, it is required to be offset by the value of the intermediate frequency thereof.

Referring now to FIGURE 2 there is shown the variable frequency divider 6 of FIGURE 1 in greater detail. The variable frequency divider 6 comprises 3 decade counting stages D1, D2, and D3 interconnected so as to count units, tens and hundreds respectively, the input to the divider being along lead 11. Each decade counter has two modes of operation these being determined by the state of associated bi-stable devices F1 and F2 respectively.

Considering firstly counting stage D1 and its associated bistable device F1. When the bistable device F1 is in one of its stable states, say "0" state, then it is arranged that the counting stage D1 counts up to 9 and is then reset to 0 thus . . . 8, 9, 0, 1, 2, 3, etc. With bistable device F1 in its other ("1") state it is arranged and the bistable stage D1 counts normally up to 9 and then, instead of being reset to 0, is reset to any number 0–9 (determined by a decade selector switch not shown). At this point it is also arranged that the bistable device F1 is reset to its "0" state so that the counting stage D1, continues to count normally. Thus, if during a count cycle the bistable device F1 is set to its "1" state, and the decade selector switch (not shown) is set to 4, then the count will be as follows:

```
. . . 8 9 0 1 2 3 4 5 6 7 8 9 4 5 6 7 8 9 0 1 2 . . .
          └───────────────────┘ │
           F1 SET TO "1"        │
               STATE            ↓
                              D1 RESET TO 4 AND
                              F1 RESET TO "0" STATE
```

The count with bistable device F1 in its "0" state is referred to as the normal cycle and the count with bistable device F1 in its '1" state is referred to as the reset cycle. It is usually convenient to set the bistable device F1 at the same time as a pulse leaves the counting stage D1 so that the reset cycle in the example above is

```
. . . 8 9 0 1 2 3 4 5 6 7 8 9 4 5 6 7 8 9 0 1 2 . . .
        ↑                             ↑
        └─────────────────────────────┘
```

The counting stage D2 and its associated bistable device F2 operates in exactly the same way as counting stage D1 and its associated bistable device F1.

The arrangement operates by counting the required number in each decade in turn, starting with the most significant (D3), using the previous decades D1 and D2 as tens dividers to give the required significance. Having counted up to the required number, the decade D3, triggers the previous decade D2's bistable device F2. Decade D2 now goes on to re-set cycle giving no further carries until it has counted up to its own set number. The process continues to the units decade D1 then the cycle repeats. This cycle of events through the whole counter divider is termed "the count cycle."

In practice it is unnecessary to make the complete re-set cycle occur in a decade before passing the count to previous decades. Provided a re-set cycle occurs in each decade once for every count cycle then the required total count will be obtained. The numbers counted will correspond to ten minus the number re-set for each decade (re-set is from 9 so the number counted is 9 minus the number re-set plus 1 input for the actual re-set).

Decade counter D3 is never required to count in tens because there is no following decade counter. No bistable device F is required therefore and the re-set cycle is permanently connected. The 9 state of decade count of D3 is used to inform the previous decade counter D2 that the hundreds count is complete and the tens decade D2 can now change to the re-set cycle. This is achieved simply by triggering bistable device F2.

The operation of the variable divider as illustrated in FIGURE 2 will now be described for a particular division operation. If, for example, it is required to divide by 432 then the re-set controls are arranged to give re-set numbers of 6, 7 and 8 in decade counters D3, D2 and D1 respectively. With the re-set cycle permanently connected into decade counter D3, the counters D1 and D2 count in tens until decade counter D3 reaches the 9 state at which point bistable device F2 is triggered by a pulse from the decade counter D3 along lead 12.

The tens decade counter D2 now counts to 9 and re-sets to the required 7. At the same time bistable device F2 is re-set and it is convenient to use the re-setting of bistable device F2 to set bistable device F1. The re-set cycle in decade counter D2 therefore waits, incomplete, while the previous decade counter D1 goes into the re-set cycle.

Decade counter D1 now counts to 9 and re-sets to the required 8. It then reverts to tens counting. Carries from decade counter D1 complete the re-set cycle of decade counter D2 and carries from decade counter D2 re-set decade counter D3. The hundreds in decade counter D3 now count up to the 9 state once more and the cycle repeats.

A detailed breakdown of the count in the above example, starting from the point where decade counters D1 and D2 are at 0 and decade counter D3 is at 9, is given in the following table:

| No. of input pulses between states | Decade States $D_1$ | $D_2$ | $D_3$ | Operation |
|---|---|---|---|---|
| | 0 | 0 | 9 | $D_3$ "9" output sets $F_2$. |
| 90 | | | | |
| | 0 | 9 | 9 | $D_2$ on "9", $F_2$ is set therefore $D_2$ ready to reset. |
| 10 | | | | |
| | 0 | 7 | 9 | Carry from $D_1$ resets 7 in $D_2$ and also resets $F_2$, $F_2$ re-setting sets $F_1$. |
| 9 | | | | |
| | 9 | 7 | 9 | $D_1$ on "9". $F_1$ is set therefore $D_1$ ready to reset. |
| 1 | | | | |
| | 8 | 7 | 9 | Input resets 8 in $D_1$ and also resets $F_1$. |
| 2 | | | | |
| | 0 | 8 | 9 | Normal counting. |
| 20 | | | | |
| | 0 | 0 | 6 | Carry from $D_2$ resets 6 in $D_3$ ($D_3$ permanently in "reset from 9" condition). |
| 300 | | | | |
| | 0 | 0 | 9 | Normal count of 300 brings decades to 009 state for cycle to repeat. |
| 432 Total | | | | |

Because each decade counter has completed one re-set cycle while the previous decade counters act as tens dividers, the required number is counted.

The variable divider illustrated can be set to any three figure number whose value is read directly on the decade setting knobs (not shown) marked with the complement of the re-set number for the decades they control.

Since each bistable device F triggers once every count cycle, a final output pulse can be obtained from any of them. In practice, the output from bistable device F1 is favoured since its resolution referred to the input pulses is the most exact.

Special conditions apply to the setting of a 0 or a 1 in decade counter D3 but with the arrangement of FIGURE 2 the above counting analysis will be found to apply to all other numbers.

The description thus far discloses the operation of the variable frequency divider 6 for dividing by the number set into it on its controls. The operation will hereinafter be described wherein the variable frequency divider divides by a number which differs by a predetermined amount from that set into it.

The bistable device F sets in each decade counter as it changes from 9 to 0. The decade re-set cycle then counts a normal count 0–9 followed by a re-set cycle to the required number. For example for a re-set cycle of a 6 the following count takes place:

```
                        F sets—                          Resets—
Normal cycling............8,9,        0,1,2,3,4,5,6,7,8,9,        6
7,8,9,0,1..................normal cycling
```

In order to change the count from that set into the variable frequency divider the count is modified during the 0–9 phase of the re-set cycle. The point at which the decade counter reaches 4 during this 0–9 phase of the re-set cycle is a convenient number from which to modify the count. On reaching the count of 4 a further set of re-set gates (FIGURES 3A and 3B) are opened and another number can be set into the decade counter. For example setting a 2 would modify the above described count to the following:

```
                         F sets─┐           Extra
                                │           Reset─┐
                                ↓                 ↓
Normal cycyling......8,9,       0,1,2,3,4,         2,3,4,5,6,7,8
                                                  ─────
                                                  addition count

          Normal
          Reset─┐
                ↓
                6,7,8,9,0,1,............normal cycling
```

Thus three extra pulses are counted in the decade counter irrespective of the setting of the decade's controls. The control loop therefore increases the frequency of the oscillation generator by an amount corrsponding to three divisions of the particular decade setting.

Similarly if a 7 is set, for the modification, the count is as follows:

| | F sets ↓ | Extra Reset ↓ | Extra Reset ↓ |
|---|---|---|---|
| Normal cycling..8,9, | 0,1,2,3,4, | 7,8,9, | 6,7' |

8,9,0,1--------normal cycling

Here two fewer pulses are counted and this gives a frequency decrease of two divisions. By this means frequency shifts on any decade counter between plus 5 and minus 4 can be achieved as will be described in further detail with reference to FIGURES 3A and 3B.

Referring now to FIGURES 3A and 3B there is shown in greater detail one decade counting stage of the variable frequency divider shown in FIGURE 2.

The decade counting stage illustrated comprises six bistable devices A, B, C, D, E and F, both sides of all of which are driven in parallel. Each of the two drive inputs to each of the bistable devices includes a series connected AND gate A′, A″, B′, B″, C′, C″, D′, D″, E′, E″, F′ and F″ and gates being controlled from outputs from the bistable devices B, C, D, and E such that the conditions of the bistable devices operate according to the code set forth below:

| $S_A$ | S ----- | A | B | C | D | E |
|---|---|---|---|---|---|---|
| 1 | 0 | 1 | 1 | 0 | 0 | 0 |
| 1 | 1 | 1 | 1 | 0 | 0 | 1 |
| | | Not reset | | | | |
| 1 | 2 | 1 | 1 | 0 | 1 | 1 |
| 1 | 3 | 0 | 1 | 0 | 1 | 0 |
| 1 | 4 | 0 | 1 | 1 | 1 | 0 |
| 0 | 5 | 0 | 1 | 1 | 0 | 0 |
| 0 | 6 | 0 | 1 | 1 | 0 | 1 |
| 0 | 7 | 0 | 0 | 1 | 0 | 1 |
| 0 | 8 | 0 | 0 | 1 | 0 | 0 |
| 0 | 9 | 0 | 0 | 0 | 0 | 0 |

The bistable devices are such that a "0" state is represented by a positive potential on the left hand output terminal or a negative potential on the right hand output terminal and a "1" state is represented by a negative potential on the left hand output terminal or a positive potential on the right hand output terminal. The AND gates are such that with a negative potential on all inputs a signal is passed to the associated input of an associated bistable device. As can be seen from the table above the ten states, 0–9, of the counting stage are represented by the different combinations of conditions of bistable devices B, C, D and E. Bistable device A is arranged to trigger as the state of the counting bistable devices changes from 9 to 0 for the single purpose of passing a carry to the next decade counter.

As previously described with reference to FIGURE 2 the arrangement has two modes of operation, normal cycle and re-set cycle. The state of bistable device F determines which mode of operation is to be followed. With bistable device F in the 0 state the counting bistable devices cycle from 9 to 0, 1, 2, 3 etc., i.e. the decade counter acts as a divide by ten units giving one carry for every ten inputs. With distable device F in the "1" state, the counting bistable devices are arranged to count normally to 9, then, instead of passing on to 0, any number 0–9 can be set into the bistable devices.

This change of count is performed by re-arranging the gating to the bistable devices, the re-arranged gating arrangements being provided by additional AND gates A‴, B‴, C‴, D‴, E‴ provided in a further input path to the right hand side inputs of bistable devices A, B, C, D, and E respectively. Switches SWA, SWB, SWC, SWD, and SWE (not shown) connected to inputs of AND gates A‴, B‴, C‴, D‴ and E‴ respectively control the number which is to be set into the counting stage. With a positive potential applied by any of the switches its associated bistable device is left in a "0" state, with a negative potential being applied by any of the switches the associated bistable devices are set to a "1" state from "0" state. In practice the switches SWA to SWE are in the form of a single decade selector switch. At the point when bistable devices B, C, D, and E, begin a re-set cycle as opposed to a normal cycle the input is also arranged to re-set bistable device F so that bistable devices B, C, D and E cycle in tens once more until bistable F is set again.

Further AND gates V, W, X, Y and Z are provided in further series input circuits to bistable devices A, B, C, D and E respectively, gates V, W, X and Y being connected to the left hand side inputs of their associated bistable devices, AND gate Z being connected to the right hand side input of its associated bistable device. These gates V, W, X, Y and Z control the further re-set operation which can be included in a re-set cycle to change the division ratio from that set by switches SWA, SWB, SWC, SWD and SWE. Gates W, X, Y and Z are controlled by corresponding associated switches, SWW, SWX, SWY and SWZ (not shown).

In order to include the further re-set operation in the counting stage, count 4 of the re-set cycle is recognised by bistable device C changing to "1" and the outputs from bistable devices A and C are then utilized to open gates V, W, X, Y and Z.

Using the correct combination of the re-set gates V, W, X, Y and Z, any number 0–9 can be re-set during the further re-set operation giving a change in division ratio of plus 5 to minus 4. The potentials to be applied to these gates to give the required change of division ratio is as shown in the table below:

| | Gate Control Potentials | | | | Freq. Shift |
|---|---|---|---|---|---|
| | W | X | Y | Z | |
| Reset No.: | | | | | |
| 0 | + | − | − | + | +5 |
| 1 | + | − | − | − | +4 |
| 2 | + | − | + | − | +3 |
| 3 | + | − | + | + | +2 |
| 4 | + | + | + | + | +1 |
| 5 | + | + | − | + | 0 |
| 6 | + | + | − | − | −1 |
| 7 | − | + | − | − | −2 |
| 8 | − | + | − | + | −3 |
| 9 | − | − | − | + | −4 |

It can be seen that the re-set number is conveniently controlled by 4 DC connections. This further reset operation can effectively be switched on and off using these connections. When no further re-set is required a further re-set value of 5 may be selected giving an apparently normal re-set cycle.

What I claim is:

1. A frequency divider for affording a variable, decimalised division ratio comprising a plurality of cascade connected counters, each counter corresponding to a digit in the division ratio, a plurality of bistable devices forming each of said counters, switch means associated with each of the counters operable to set into the divider a first division ratio, and control means associated with each of the counters, excepting that corresponding to the most significant digit of said first division ratio, effective for changing the division ratio of the frequency divider by a predetermined amount from said first division ratio set into the divider by said switch means.

2. A frequency divider as claimed in claim 1 in which the control means associated with respective counters of the frequency divider comprises first gating means which is operable for causing the bistable devices of its respective counter to be operable according to two different cycling modes, whereby according to a first cycling mode, the respective counter counts up to a state corresponding to a predetermined number and is then reset to a state corresponding to zero, and according to a second cycling mode, the respective counter counts up to a state corresponding to a predetermined number and is then reset to a state corresponding to a selectively pre-set number.

3. A frequency divider as claimed in claim 2, in which the control means comprises second gating means operable, when a counter operating in its second cycling mode has reached a predetermined state, for causing resetting of said counter to a state corresponding to a second selectively preset number.

4. A frequency divider as claimed in claim 3, in which the second gating means comprises a plurality of "AND" gates interconnected with the first gating means, and effective for changing the division ratio of the frequency divider by a predetermined amount from said first division ratio set into the divider by said switch means.

References Cited

UNITED STATES PATENTS

| | | | |
|---|---|---|---|
| 2,563,841 | 8/1951 | Jensen | 328—48 XR |
| 2,749,437 | 6/1956 | Parr | 328—48 |
| 3,333,209 | 7/1967 | Hugenholtz | 328—30 XR |

ARTHUR GAUSS, *Primary Examiner.*

JOHN ZAZWORSKY, *Assistant Examiner.*

U.S. Cl. X.R.

328—42, 46